US011721550B2

(12) United States Patent
Warren et al.

(10) Patent No.: US 11,721,550 B2
(45) Date of Patent: Aug. 8, 2023

(54) METHODS FOR DEPOSITING III-ALLOYS ON SUBSTRATES AND COMPOSITIONS THEREFROM (71) Applicants: United States Department of Energy, Washington, DC (US); COLORADO SCHOOL OF MINES, Golden, CO (US)

(72) Inventors: Emily Lowell Warren, Golden, CO (US); Jeramy David Zimmerman, Golden, CO (US); Olivia Dean Schneble, Golden, CO (US)

(73) Assignee: United States Department of Energy, Washington, DC (US)

( * ) Notice: Subject to any disclaimer, the term of this patent is extended or adjusted under 35 U.S.C. 154(b) by 160 days.

(21) Appl. No.: 17/495,913

(22) Filed: Oct. 7, 2021

(65) Prior Publication Data

US 2022/0108889 A1 Apr. 7, 2022

Related U.S. Application Data (60) Provisional application No. 63/088,630, filed on Oct. 7, 2020.

(51) Int. Cl.
H01L 21/00 (2006.01)
H01L 21/02 (2006.01)

(52) U.S. Cl.
CPC .. *H01L 21/02653* (2013.01); *H01L 21/02381* (2013.01); *H01L 21/02392* (2013.01); *H01L 21/02543* (2013.01); *H01L 21/02546* (2013.01); *H01L 21/0243* (2013.01); *H01L 21/02164* (2013.01); *H01L 21/02208* (2013.01); *H01L 21/02211* (2013.01); *H01L 21/02282* (2013.01); *H01L 21/02433* (2013.01); *H01L 21/02634* (2013.01)

(58) Field of Classification Search
CPC ......... H01L 21/02005; H01L 21/02381; H01L 21/02532; H01L 21/02576; H01L 21/02579; H01L 21/0262; H01L 31/028; H01L 31/1804
See application file for complete search history.

(56) References Cited

U.S. PATENT DOCUMENTS

| | | | | |
|---|---|---|---|---|
| 2008/0012074 A1* | 1/2008 | Braymer | ........... | H01L 21/02216 257/E29.151 |
| 2017/0260651 A1* | 9/2017 | Robinson | .......... | H01L 21/02444 |
| 2020/0365447 A1* | 11/2020 | Mays | ................ | H01L 21/76224 |

* cited by examiner

*Primary Examiner* — Richard A Booth
(74) *Attorney, Agent, or Firm* — Felisa Leisinger; Aaron R. Keith; Karen Blouin

(57) ABSTRACT

A method for depositing III-V alloys on substrates and compositions therefrom. A first layer comprises a Group III element. A second layer comprises a silica. A substrate has a surface. The second layer is deposited onto a first layer. The depositing is performed by a sol-gel method. The second layer is exposed to a precursor that comprises a Group V element. At least one of the precursor or the Group V element diffuse through the silica. The first layer is transformed into a solid layer comprising a III-V alloy, wherein at least a portion of the first layer to a liquid. The silica retains the liquified first layer, enabling at least one of the precursor or the Group V element to diffuse into the liquid, resulting in the forming of the III-V alloy.

15 Claims, 6 Drawing Sheets

METHODS FOR DEPOSITING III-ALLOYS ON SUBSTRATES AND COMPOSITIONS THEREFROM

CROSS-REFERENCE TO RELATED APPLICATIONS

This application claims priority from U.S. Provisional Application No. 63/088,630 filed Oct. 7, 2020, the contents of are hereby incorporated by reference in their entirety.

GOVERNMENT INTEREST

This invention was made with government support under Contract No. DE-AC36-08GO28308 awarded by the Department of Energy. The government has certain rights in the invention.

BACKGROUND

The heteroepitaxial growth of III-V materials has long been a challenge to enable III-V performance that is compatible with silicon substrates for high performance computing, photonic integration, and low cost III-V photovoltaic devices. The integration of III-Vs and silicon can be done by vapor phase heteroepitaxy (e.g. MOVPE, MBE) or wafer bonding. However, these methods require expensive reactors or carefully controlled surfaces to enable bonding. Thus, a need remains for the development of low-cost heteroepitaxy approaches that enable changes to the cost structure for III-V/silicon integration.

SUMMARY OF THE INVENTION

Embodiments of the invention relate to a method for depositing III-V alloys on substrates and compositions therefrom. A first layer comprises a Group III element. A second layer comprises a silica. A substrate has a surface. The second layer is deposited onto a first layer. The depositing is performed by a sol-gel method. The second layer is exposed to a precursor that comprises a Group V element. At least one of the precursor or the Group V element diffuse through the silica. The first layer is transformed into a solid layer comprising a III-V alloy, wherein at least a portion of the first layer to a liquid. The silica retains the liquified first layer, enabling at least one of the precursor or the Group V element to diffuse into the liquid, resulting in the forming of the III-V alloy.

BRIEF DESCRIPTION OF DRAWINGS

Some embodiments are illustrated in referenced figures of the drawings. It is intended that the embodiments and figures disclosed herein are to be considered illustrative rather than limiting.

REFERENCE NUMERALS

100 . . . composition
110 . . . substrate (silicon)
120 . . . surface of substrate
130 . . . first layer (a Group III element or a III-V alloy)
140 . . . second layer (of silica)
150 . . . depression
200 . . . method
210 . . . patterning (the substrate)
220 . . . depositing of the first layer (e.g. Group III)
230 . . . depositing of silica by sol-gel method
240 . . . exposing (the Group III to Group V)

DETAILED DESCRIPTION

The embodiments described herein should not necessarily be construed as limited to addressing any of the particular problems or deficiencies discussed herein. References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The present disclosure relates to, among other things, heteroepitaxial templated vapor-liquid-solid (VLS) growth of III-V materials onto substrates, for example silicon. As described herein, a silica template may be deposited by a sol-gel method, according to some embodiments of the present disclosure. Among other things, silica layers deposited by a sol-gel method, onto an underlying layer of a Group III element, out-perform other methods for depositing silica templating layers. For example, as shown herein, a sol-gel deposited silica templating layer better maintains the Group III element in the liquid phase during the introduction of the Group V element (in the vapor phase), resulting in the formation of a superior III-V solid alloy on the substrate (e.g. silicon). Further, a sol-gel deposited silica templating layer provides the mechanical stability needed to maintain the Group III element in the liquid phase, while also providing sufficient mass transfer rates of the Group V element through the silica templating layer to enable reasonable processing times for manufacturing the final targeted III-V/silicon composition.

Figure 1:
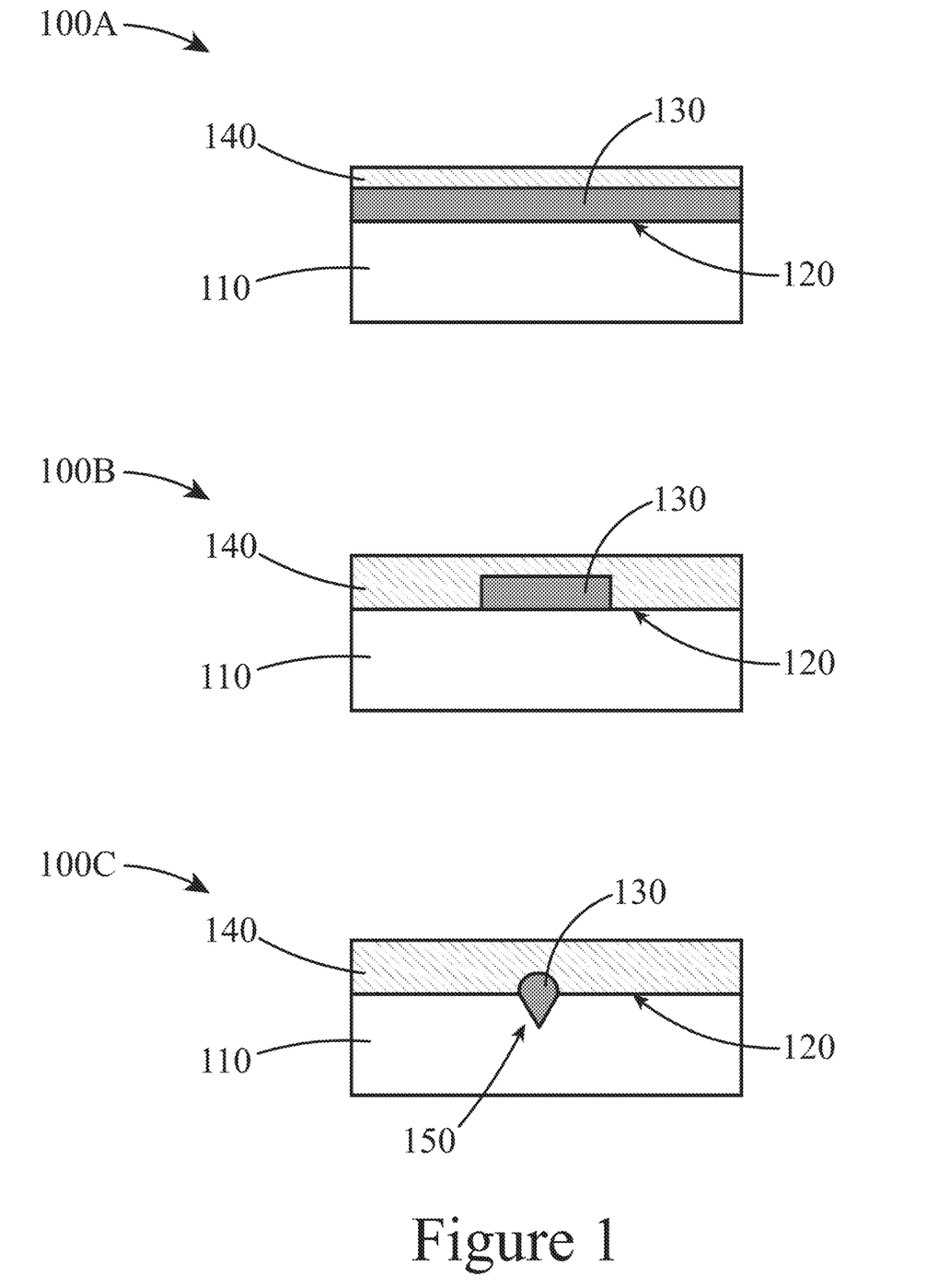
FIG. 1 illustrates compositions according to some embodiments of the present disclosure.

FIG. 1 illustrates three compositions, 100A, 100B, and 100C, according to some embodiments of the present disclosure. These compositions represent three examples of compositions having a III-V alloy successfully deposited on an underlying substrate constructed of a semiconductor material (e.g. silicon, InP), where a sol-gel deposited silica templating layer enabled the formation of the III-V alloy. Referring to FIG. 1, the first exemplary composition 100A is constructed of a first layer 130 positioned between a substrate 110 constructed of a semiconductor material and a second layer 140, the sol-gel deposited silica layer. This composition 100A shows the first layer 130 as a continuous film positioned on the substrate 110 and corresponds to a composition resulting from the homoepitaxy of the first layer 130 onto the substrate 110. Thus, in some embodiments of the present disclosure, a composition 100A may include a substrate 120 constructed of a III-V alloy having a first layer 130 constructed of the same III-V alloy positioned on the substrate 120. Examples of suitable III-V allows for both the substrate 120 and the first layer 130 include at least one of InP, GaAs, InAs, or GaP. Further, the first composition 100A of FIG. 1 also includes a second layer 140, e.g. a continuous film of sol-gel deposited silica, where the second layer 140 enables the successful conversion of the first layer 130 from a Group III material to a III-V alloy. FIG. 1 illustrates that for the embodiment of a homoepitaxial method, the first layer 130 of a composition 100A may substantially cover the entire surface 120 of the substrate.

The second composition 100B and the third composition 100C shown in FIG. 1 represent two embodiments of heteroepitaxial compositions, where the first layer 130 is made of a material that is different from the material of the underlying substrate 120. However, both compositions, 100B and 100A, like the first composition 100A, include a second layer 140 positioned on the substrate 120 and the first layer 130, where the second layer 140, e.g. a sol-gel deposited silica templating layer, enables the successful conversion of the first layer 130 from a Group III material to a III-V alloy. By definition (heteroepitaxy), these two compositions, 100B and 100C, are both constructed using a substrate 110 made of a material (e.g. silicon) that is different from the material making up the first layer 130 (e.g. a III-V alloy). In some embodiments of the present disclosure, a composition, 110B and/or 100C, may include a substrate 110 constructed of at least one of silicon and/or germanium and a first layer constructed of at least one of InP, AlP, GaP, InAs, AlAs, and/or GaAs.

Referring again to the second and third compositions, 100B and 100C, of FIG. 1, the first layer 130 may be positioned on the substrate 110 in a pattern such that only a portion of the outer surface 120 of a substrate 110 is covered by a first layer 130. In some embodiments of the present disclosure, a first layer 130 may be positioned on a substrate as a plurality of islands having a specific cross-sectional shape; e.g. circular, square, etc. with a each island having a width between about 2 μm and about 25 μm. In some embodiments of the present disclosure, the first layer 130 may have a thickness between about 50 nm and about 5 μm or between about 100 nm and about 2 μm. In some embodiments of the present disclosure, the second layer 140 may have a thickness between about 20 nm and about 200 nm or between about 50 nm and about 100 nm. In some embodiments of the present disclosure, the second layer 140, e.g. a sol-gel deposited silica layer, may have a thickness between about 50 nm and about 5 μm or between about 100 nm and about 2 μm.

Figure 2:
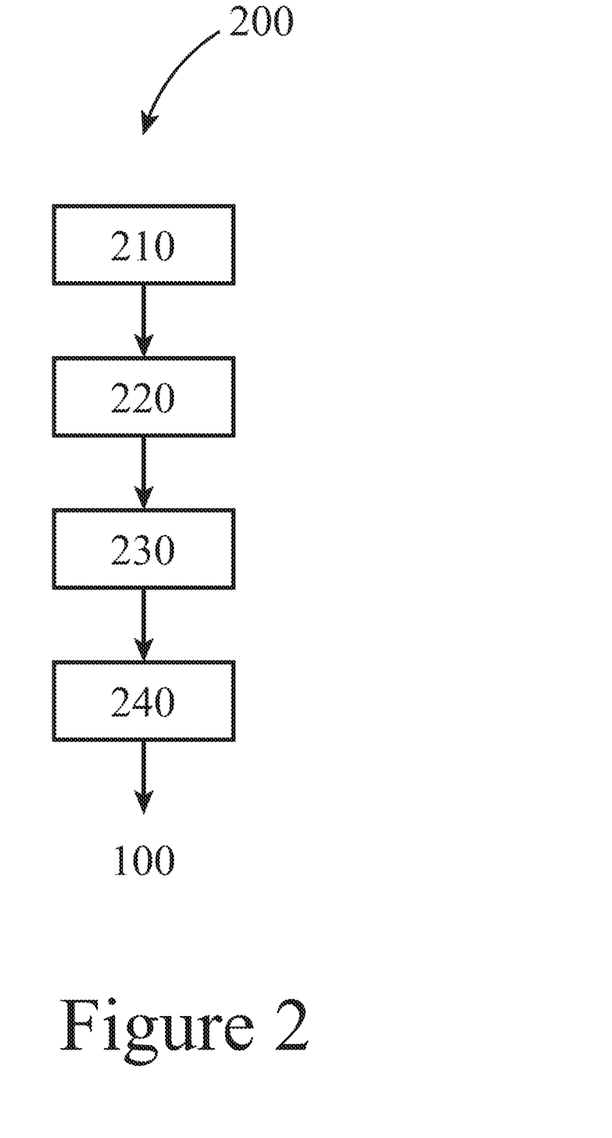
FIG. 2 illustrates a method for making the compositions illustrated in FIG. 1, according to some embodiments of the present disclosure.

FIG. 2 illustrates a method 200 for making a composition 100, like those shown in FIG. 1, according to some embodiments of the present disclosure. This exemplary method 200 begins with depositing 230 of a second layer 140 comprising silica onto a first layer 130 that includes a Group III element and a substrate 110 having a surface 120, followed by exposing 240 the second layer 140 to a precursor that includes a Group V element, resulting in the transformation of the first layer 130 from a layer of essentially only the Group III element to a solid layer of a III-V alloy. As described herein, the depositing 230 of the silica layer may be performed by a sol-gel method. Further, in more detail, the exposing 240 may convert at least a portion of the first layer 130 of the Group III element to a liquid, and the diffusion of at least one of the precursor and/or the Group V element through the second layer 140 of silica. Among other things, during the exposing 240, the second layer 140 of silica retains the liquified first layer 130, i.e. templating, enabling at least one of the precursor and/or the Group V element to diffuse into the liquid Group III element of the first layer 130, resulting in the conversion of the first layer 130 to a solid layer of the III-V alloy.

Examples of precursors that may supply the Group V element to produce the III-V alloy include at least one of phosphine, arsine, and/or triethyl antimony. Further, in some embodiments of the present disclosure, the exposing 240 of the first layer 130 of a Group III element to a Group V precursor may be performed at a temperature between about 400° C. and about 900° C. or between about 600° C. and about 750° C. The exposing 240 may be performed at a total absolute pressure between 10 Torr and about 1000 Torr, or between about 50 Torr and about 700 Torr. The exposing 240 may be performed at a partial pressure of the Group V precursor between greater than 0% c and about 20%, or between about 1% and about 10% (of the total absolute pressure or as a percentage of volume). In some embodiments of the present disclosure, as the temperature is ramped up to higher temperatures, the flow of vapor-phase precursor can begin at an intermediate temperature, which appears to encourage nucleation in all islands but not complete conversion of the first layer, or can begin at the final temperature, which appears to result in complete conversion of the first layer in some islands and no visible conversion in any islands.

As described herein, depositing 230 of a silica layer may be performed by a sol-gel method. In some embodiments of the present disclosure, a sol-gel method may be performed by mixing a silane, such as tetramethylorthosilane (TMOS) and/or methyltrimethoxysilicate (MTMS) in a 0.9:1 molar ratio with n-propanol in a about a 1:1 ratio of moles n-propanol to moles silicon in the precursors. Increasing the TMOS may decrease the resulting gel viscosity, while decreasing the fraction of TMOS may create a more stable gel but can result in more organic compounds in the final silica. With mechanical stirring and room temperature water bath, acidic water (1M formic acid, pH=1.87) may be added slowly from a burette. The exothermic reaction can be kept below 35° C. by adding slowly, over a time period of about 10 minutes. The temperature can also be actively maintained with a cooling bath. The solution may be left to react for a period of time up to about 45 minutes, then diluted with n-propanol to a concentration of about 0.78 mol Si/kg hydrolysis mixture. The sol-gel solution may then be stored at a temperature below about 0° C. Other dilutents can include an $H_2O$ and n-propanol mixture or methanol (MOH), added after the reaction, or acetone and/or MOH cosolvents, added before the reaction with acidic water.

In some embodiments of the present disclosure, a method 200 may further include, prior to the depositing 240 of a silica templating layer, the patterning 210 the surface 120 of the substrate 110, and the first layer 130 (Group III element or III/V alloy) is subsequently positioned on the surface 120 of the substrate 110, according to the pattern by another depositing step 220. In some embodiments of the present disclosure, the patterning 210 may be performed by at least one of photolithography, etching, blistering a first metal oxide layer (not shown) positioned on the substrate 110, and/or cracking a second metal oxide layer (not shown) positioned on the substrate 110. In some embodiments of the present disclosure, a first metal oxide layer (not shown) and/or a second metal oxide layer (not shown) for cracking and/or blistering may each include at least one of $SiO_2$ and/or $Al_2O_3$. Thus, a method 200 may include, prior to the depositing 220 of the first layer, a preliminary depositing (not shown) of the metal oxide layer (not shown), used for blistering and/or cracking, onto the substrate 110.

In some embodiments of the present disclosure, patterning 210 may be performed by etching the surface 120 of the substrate 110, where the etching forms a plurality of depressions 150 in the surface 110, defining the targeted pattern. As a result, during the depositing 220 of the first layer 130 (e.g. Group III element and/or III-V alloy), the first layer 130 may substantially fill at least a portion of the plurality of depressions, such that the first layer 130 maintains the original pattern resulting from the etching. As a result, the first layer 130 may be present on the substrate 110 as a plurality of islands of the first layer 130 distributed across the surface 120 of the substrate 110.

Pattering 210 by etching may be achieved by first depositing a "hard mask" or inorganic and nonconducting material such as silicon nitride or silica, which can be done by CVD or thermal growth on Si, that is then patterned by lithography and etched with a hydrofluoric acid (HF) solution. The material could also be dry-etched by RIE after lithography. The hard mask is necessary to withstand the potassium hydroxide (KOH), which removes many polymers like photoresist. The KOH is heated to 60 C, then the substrates are dipped in 2% (non-buffered) HF for about 15 seconds, rinsed in DI H2O, and submerged in the KOH for 5-15 min, depending on feature size The dilute HF is necessary to remove native oxide from Si before trying to etch the Si substrate. Referring again to FIG. 2, prior to the depositing 230 by a sol-gel method, the first layer 130 may be deposited onto the surface 120 of the substrate 110 by another depositing step 220. In some embodiments of the present disclosure, the depositing 220 of the first layer 130 may be performed by at least one of an electroplating method and/or an evaporating method. For example, an electroplating method for depositing the first layer 130 of a Group III element may include placing the substrate in an indium sulfamate ($In(H_2NSO_3)_3$) plating bath and cathodically electroplating material using an indium ingot as a counter electrode. The metal is deposited by a pulsed method wherein a high current density (250 $mA/cm^2$) is applied for about 1 second one or more times, with 1 s pauses, before a lower current density (20 $mA/cm^2$) is applied for a time period between about 1 second and about 180 seconds, depending on the desired thickness.

In some embodiments of the present disclosure, the sol-gel and any remaining material from the first layer can be removed by HF for further processing.

As described in more detail below, the present disclosure describes templated vapor-liquid-solid (T-VLS) growth methods for, among other things, the direct heteroepitaxy of InP on silicon. It is shown herein, that T-VLS growth allows homoepitaxy on InP substrates and heteroepitaxy on silicon substrates. Further, it is shown herein that a spin-coated sol-gel method produces a silica layer (i.e. $SiO_x$) that mechanically confines the liquid Group III metal better than silica layers produced by evaporation methods, thereby allowing growth of the targeted III-V alloys in predefined shapes of the patterned Group-III metal. Electroplating was also used to selectively deposit the layer of Group III material onto the substrate, as an alternative to evaporation and liftoff. As shown herein, both evaporated and electroplated indium layers can be converted to shape-controlled, heteroepitaxial InP layers on silicon substrates.

T-VLS, as shown herein, can produce heteroepitaxial InP layers on silicon substrates with good templated shape control from both evaporated and electroplated layers of indium metal. It is shown herein that $SiO_2$ capping layers deposited by evaporation methods are insufficient for confining liquid indium on silicon, which has a high surface energy. Therefore, as described herein, a method has been developed utilizing a spin-coated sol-gel method for producing $SiO_2$ capping layers that perform better at constraining the Group III element layer, resulting in better conversion to the targeted III-V alloy layer. It is also demonstrated that selective electrodeposition of indium into pyramidal pits (i.e. depressions) in a silicon substrate can be successfully converted into heteroepitaxial InP layers. Thus, electrodeposition can extend the capabilities of T-VLS, as implementing photolithography for sub-micron patterning of indium is difficult.

In some embodiments of the present disclosure, a VLS method was used to grow an InP layer homoepitaxially on ab InP layer in both thin-film and templated-geometry configurations, compositions 100A and 100B/C respectively in FIG. 1. The thin-film samples were prepared by evaporating a 700 nm thick indium layer and a 50 nm thick $SiO_2$ capping layer by electron-beam evaporation (e-beam) on an (001) InP substrate. The $SiO_2$ capping layer was evaporated without breaking vacuum to prevent the indium from oxidizing in air. Half of the InP substrate was used to demonstrate a spin-coated sol-gel method for depositing a $SiO_x$ where x is between 1 and 2, inclusively capping layer on the InP substrate to provide a comparison of the two $SiO_x$ capping layers deposited by the two different methods. Templated VLS samples were prepared by patterning 5 μm wide holes in photoresist on an (001) InP wafer by photolithography, evaporating 500 nm thick layers of indium, followed by evaporating 20 nm thick $SiO_2$ layers onto the indium, or, for comparison, depositing by a sol-gel method, a $SiO_x$ layer having a thickness between about 300 nm and about 550 nm onto the indium islands immediately after liftoff of the indium and $SiO_2$. The sol-gel coated samples were dried on a hot plate at about 100° C. for about 30 minutes, to evaporate the solvents used in the sol-gel method; the $SiO_x$ network fully sintered during the exposing step, as described above.

The thin-film samples (e.g. composition 100A in FIG. 1) were each annealed at 600° C. with exposure to phosphine (e.g. Group V precursor, $PH_3$) for about 20 minutes, resulting in partially converted homoepitaxial InP layers positioned on the InP substrates. The starting indium layer capped by an evaporation-deposited $SiO_2$ layer (see Panel (a) of FIG. 3) was significantly more converted to the targeted InP alloy layer than indium layer capped with a silica layer by the sol-gel method (see Panel (b) of FIG. 3), indicating a slower conversion rate of indium to the III-V alloy through the sol-gel-deposited $SiO_x$ layer. Laser confocal scanning microscopy (LCSM) imaging was used to resolve the film height and distinguish shadows from differences in material composition. The darker regions were confirmed as InP and the lighter regions indium through energy dispersive x-ray spectroscopy (EDS) mapping, as highlighted in Panel (c) of FIG. 5. Interfaces between remaining indium and converted InP showed rectangular facets aligned to the (110) and (110) planes of the cubic lattice of the (001) substrate, which is indicative of epitaxial alignment. X-ray diffraction (XRD) (see FIG. 4) shows only the InP (002) peak and no InP (111) diffraction. Given that non-epitaxial films typically show a large InP (111) peak, this suggests that primarily epitaxial growth has occurred in the starting indium layer.

Figure 3:
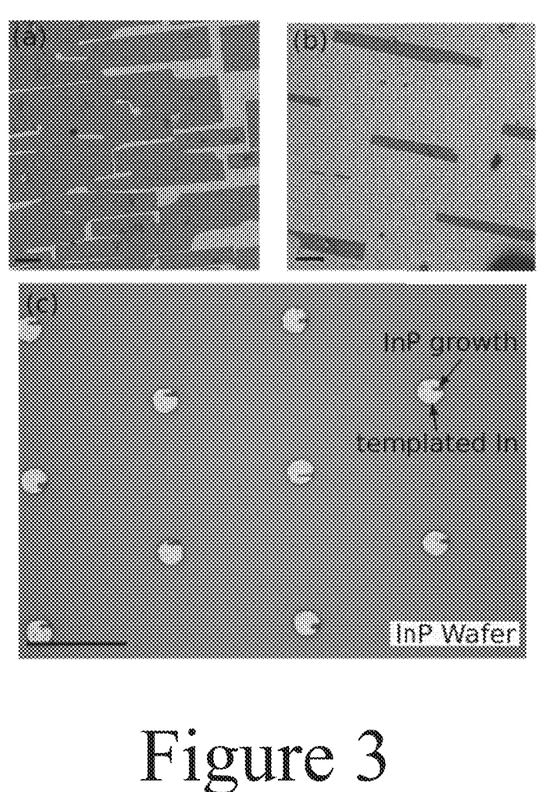
FIG. 3 illustrates according to some embodiments of the present disclosure: (a) Laser confocal scanning microscope (LCSM) image of an InP layer grown by templated vapor-liquid-solid (T-VLS) methods as described herein (darker regions), grown from starting In layer having a thickness of about 700 nm (lighter regions) capped with an e-beam deposited layer of $SiO_2$, (b) LCSM image of T-VLS InP layer grown from a 700 nm thick starting In layer capped with either an e-beam deposited SiO2 layer or a sol-gel deposited $SiO_2$ layer, (c) Optical image of templated In on InP wafer showing rectangular InP growths. Scale bars all 20 µm.
Figure 4:
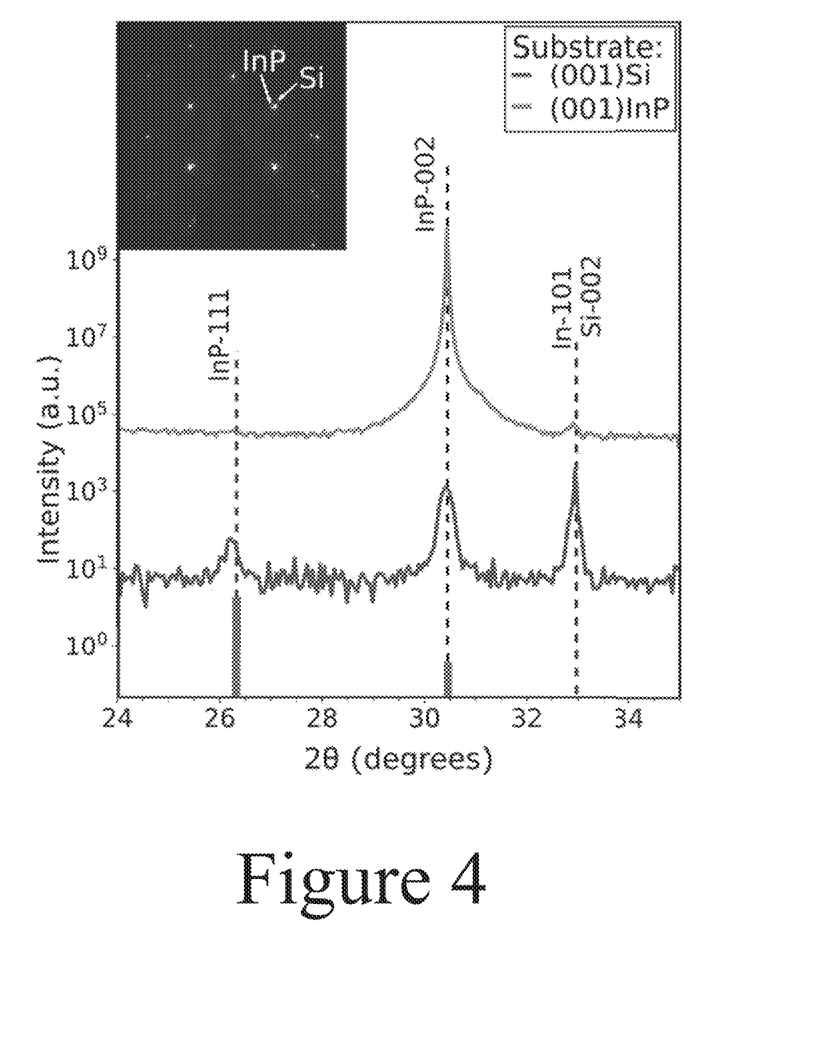
FIG. 4 illustrates symmetric $\omega$-$2\theta$ XRD scan of partially-converted (001) Si (blue) and (001) InP (orange), offset for clarity, according to some embodiments of the present disclosure. Green bars show the calculated InP powder peak locations and relative heights for the InP (111) and (002) reflections. Selected-area electron diffraction (SAED) of T-VLS InP grown on (001) Si shows epitaxial alignment in all directions, meaning the T-VLS material is not just textured, but truly epitaxial.

Templated VLS samples (composition 100B/C in FIG. 1 and Panel (c) of FIG. 3) were annealed at 600° C. with the same amount of $PH_3$ (Group V precursor), about 1% of total flow by volume, for about 5 minutes to explore nucleation phenomena. The patterned T-VLS deposited islands show a single rectangular InP region each. Roughly 20% of the starting templated indium area capped with $SiO_x$ by sol-gel method was converted to InP, larger than the converted fraction of the starting planar indium layer capped with $SiO_x$ by sol-gel method, suggesting a faster nucleation and growth process in the patterned T-VLS InP. All InP regions (i.e. layers) touch the edges of their indium islands, suggesting that growth begins there. The aligned rectangular regions of InP layers also suggest epitaxial alignment of the templated, sol-gel-capped T-VLS deposited starting indium layers.

A similar process to that described above was used to prepare heteroepitaxial films of InP on silicon substrates, via templated VLS. On (001) Si wafers, indium islands with diameters between about 3 μm and about 25 μm were patterned and capped with $SiO_2$ by evaporation. As shown in Panel (b) of FIG. 5, capping the indium starting islands with $SiO_2$ by e-beam did not prevent the indium metal from de-wetting when melted. Additional $SiO_2$ thickness provided by e-beam evaporation after liftoff also failed to confine the liquid indium due to shadowing. Therefore, $SiO_x$ deposited by the sol-gel methods described herein were used to conformally coat the patterned indium, as shown in Panel (c) of FIG. 5. All samples on silicon substrates were annealed in 1% $PH_3$ (i.e. Group V precursor) by volume. The samples illustrated in Panel (b) of FIG. 5 were annealed at about 600° C. for about 15 minutes, and the samples shown in Panel (c) of FIG. 5 were annealed at about 750° C. for about 10 minutes, to intentionally leave the starting indium islands only partially converted InP to show the nucleation process. The sample used for XRD (see FIG. 4) was annealed at about 600° C. for about 40 minutes to more fully convert the starting indium layer to an InP layer.

As before, the starting indium layer capped/confined with a sol-gel deposited $SiO_x$ layer converted to an InP layer during the annealing step much more slowly than the indium capped with $SiO_2$ by e-beam evaporation. However, because the indium layer stayed in place better with the $SiO_x$ capping layer (by sol-gel method), the interfaces between In and InP are much easier to resolve. Those islands show one InP region per island of starting indium (see Panel (c) of FIG. 5). Unlike the InP nuclei on the InP substrates, these InP regions on silicon substrates did not preferentially show 90° angles, potentially indicating that the InP layers lack strong epitaxial alignment. However, XRD (see FIG. 4) of templated VLS formed InP layers on (001) silicon substrates shows an increase of the normally weak InP (002) peak only on the (001)-oriented silicon substrates. Therefore, the template VLS formed InP layers are likely taking on the substrate lattice orientation in most, though not all, grains. Selected-area electron diffraction (SAED) of one such grain (see the inset of FIG. 4) confirms that the XRD results indicate epitaxial orientation in all directions. The brighter spots show diffraction from the thicker silicon substrate, while the fainter spots indicate the thinner epitaxial layer, which is single-crystal but slightly offset from the silicon pattern due to a slight lattice tilt.

Figure 5:
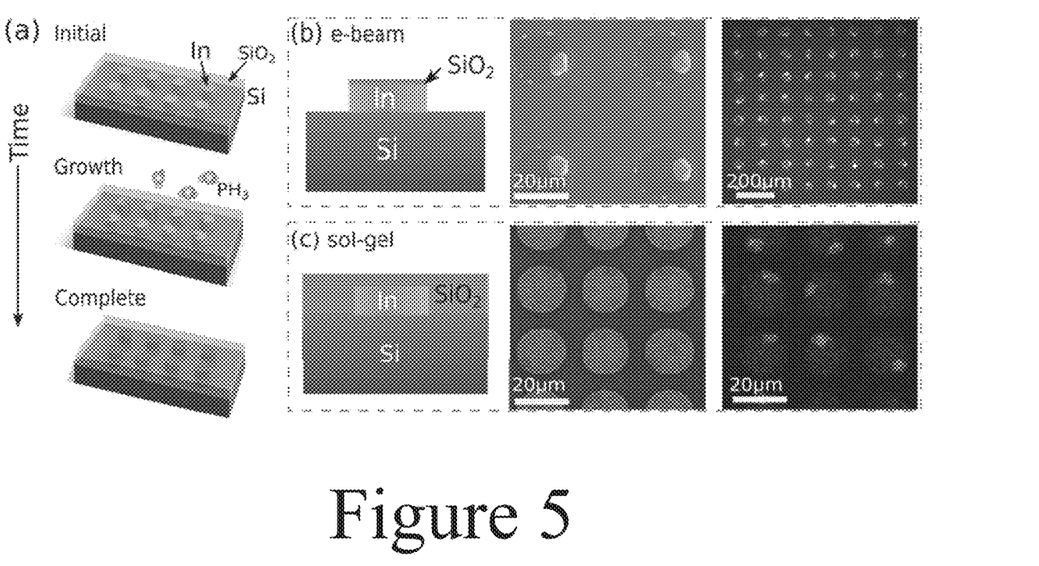
FIG. 5 illustrates according to some embodiments of the present disclosure: (a) a schematic of a T-VLS growth method as described herein, (b) a patterned InP layer with only an e-beam deposited $SiO_2$ layer on (001) Si shown in cross-section schematic (left), plan-view SEM (center), and mapping photoluminescence (right). (c) A patterned In layer with a sol-gel deposited $SiO_2$ layer that has been partially phosphorized on (001) Si shown in cross-section schematic (left), plan-view SEM (center), and energy-dispersive x-ray spectroscopy map (EDS) (right), in which pink indicates In-L emission and yellow indicates P-K emission.

The XRD peak at $2\Theta \cong 23.9°$ suggests that both the Si (002) and In (101) reflections are present, indicating remaining In metal. The Si (002) peak is an artifact of the measurement at certain angles of ϕ (in-plane rotation of the substrate). Finally, Panel (b) of FIG. 5 shows mapping photoluminescence (PL) of T-VLS produced InP layers on silicon substrates taken at room temperature with a GaAs filter. The InP regions luminesce when filtered for the InP bandgap, indicating sufficient material quality to be optically active.

T-VLS produces islands tens of μm in diameter are therefore viable heteroepitaxial structures, but, for sub-micron and/or high aspect ratio features, the standard photolithographic processes described thus far may be insufficient. Selective electroplating extends the flexibility of the T-VLS technique, as it can be applied to openings in a dielectric coating of virtually any size. A goal of electroplating is to selectively deposit the indium metal for selective-area growth, but, because wetting is a major barrier to heteroepitaxy on silicon substrates, etch pits (i.e. depressions) were used to better confine the liquid metal indium droplets. The pits highlight another advantage of electroplating: they are easily filled by electroplating but difficult to fill uniformly by physical vapor deposition methods.

To prepare substrates for selective-area plating, n-type silicon wafers were coated with 50 nm thick $SiN_x$ (where x is between 1 and 2, inclusively) films using plasma-enhanced chemical vapor deposition. In some embodiments of the present disclosure, the silicon nitride may be $Si_3N_4$. The $SiN_x$ was patterned with photolithography and wet etched in buffered oxide etch, resulting in a mask for etching the silicon substrate with potassium hydroxide (KOH) at about 60° C. for about 12 minutes. KOH etches {111} facets of Si much slower than others, so the resulting pits are inverted square pyramids. The $SiN_x$ was left in place to act as a dielectric mask for the plating step.

Figure 6:
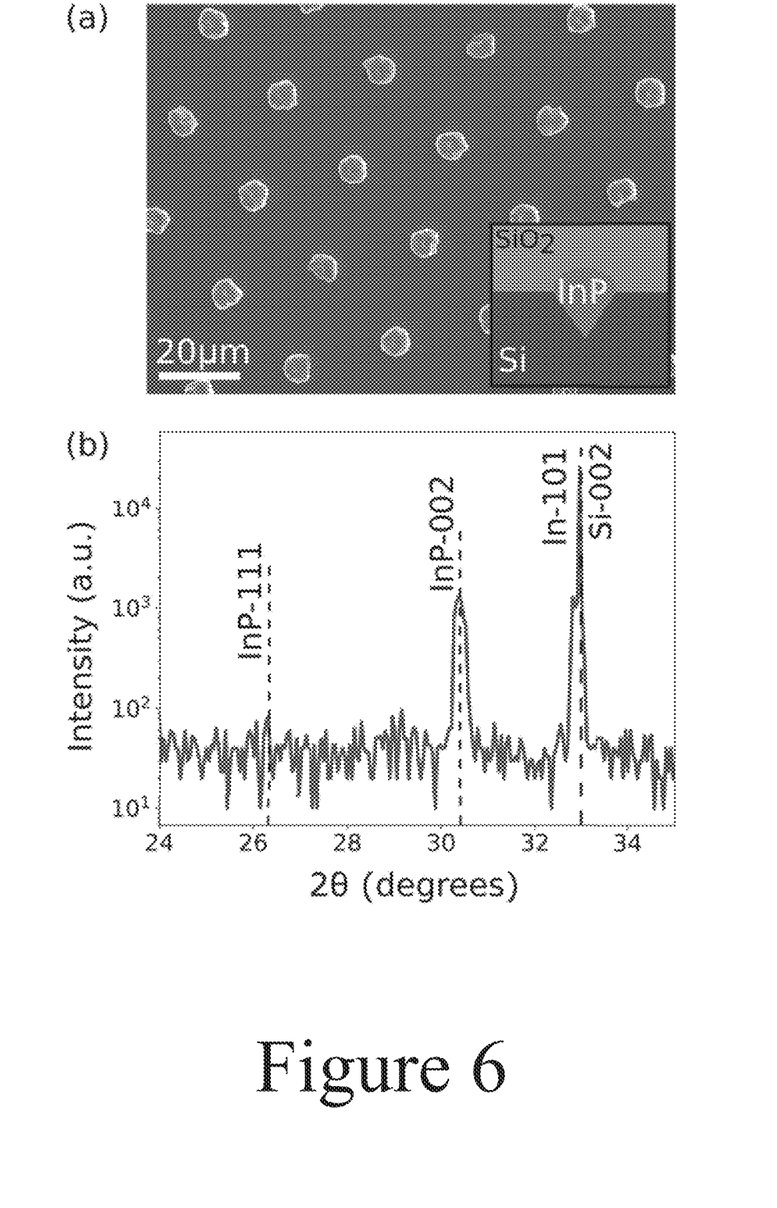
FIG. 6 illustrates according to some embodiments of the present disclosure: (a) a plan-view SEM image of a selectively plated In layer, partially converted to an InP layer, with inset cross-section schematic. (b) symmetric $\omega$-$2\theta$ XRD of selectively plated sample, showing only an InP (002) peak and no InP (111) peak. Here, the In (101) peak at $\theta$=32:960 is resolvable from the Si (002) forbidden reflection at $\theta$=32:98°.

A multi-step plating process with a high-current-density pulse at the start was used to achieve continuous starting indium layers having uniform grain sizes, as large indium grains may block further deposition in the pit corners. The indium islands were spin-coated with a sol-gel to produce $SiO_x$ capping layers as described above and converted to InP by annealing at about 600° C. in 1% PH3 for about 20 minutes. The resulting InP islands (see Panel (a) of FIG. 6) produce only an InP (002) peak in XRD (see Panel (b) of FIG. 6), which indicates epitaxial growth on the (001) silicon substrate. Because {111} silicon facets have a lower surface energy than {001} silicon facets and lower energy interaction with polar epilayer materials, exposing the InP to the {111} Si facets may preferentially enable epitaxial growth.

As shown herein T-VLS methods, in combination with at least one of electroplating methods for depositing starting layers of Group III elements and sol-gel methods for depositing $SiO_x$ capping layers on the starting Group III layers may be used to grow epitaxially aligned III-V layers on (001) Si substrates. Conversion of starting indium layers to InP was confirmed through EDS as well as XRD. X-ray and electron diffraction also showed that some grains of InP grow relaxed and oriented to the substrate. Maintaining the intended geometry is achieved more effectively using a conformal dielectric layer, such $SiO_x$ deposited by a sol-gel method. Mapping PL showed that the material is optically active, suggesting this technique has potential for optoelectronic applications. Epitaxial growth from electroplated material also extends the possibilities of T-VLS methods to enable a variety of optical components. T-VLS methods may allow compound semiconductors to be easily integrated on silicon, enabling a variety of optoelectronic components on existing complimentary metal-oxide-semiconductor (CMOS) platforms.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A method comprising:
    a depositing of a second layer comprising silica onto a first layer comprising a Group III element and a substrate having a surface; and
    exposing the second layer to a precursor comprising a Group V element, resulting in the transforming of the first layer to a solid layer comprising a III-V alloy, wherein:
    the depositing is performed by a sol-gel method,
    the exposing converts at least a portion of the first layer to a liquid,
    at least one of the precursor or the Group V element diffuse through the silica, and the silica retains the liquified first layer, enabling at least one of the precursor or the Group V element to diffuse into the liquid, resulting in the forming of the III-V alloy.

2. The method of claim 1, further comprising:
    prior to the depositing, patterning the surface of the substrate, wherein:
    the first layer is positioned on the surface of the substrate according to the pattern.

3. The method of claim 2, wherein the patterning is performed by at least one of photolithography, etching, blistering a first metal oxide layer positioned on the substrate, or cracking a second metal oxide layer positioned on the substrate.

4. The method of claim 3, wherein the first metal oxide layer and the second metal oxide layer each comprise at least one of $SiO_2$ or $Al_2O_3$.

5. The method of claim 3, further comprising:
    prior to the depositing, a preliminary depositing of the metal oxide layer onto the substrate.

6. The method of claim 3, wherein:
    the patterning is performed by etching the surface of the substrate,
    the etching forms a plurality of depressions in the surface,
    the plurality of depressions define the pattern, and
    the depositing results in the first layer substantially filing at least a portion of the plurality of depressions.

7. The method of claim 1, further comprising:
    prior to the depositing by a sol-gel method, depositing the first layer onto the surface of the substrate, wherein:

the depositing of the first layer is performed by at least one of an electroplating method or an evaporating method.

8. The method of claim 1, wherein the Group III element comprises at least one of indium, aluminum, or gallium.

9. The method of claim 1, wherein the substrate comprises at least one of silicon or InP.

10. The method of claim 1, wherein the Group V precursor comprises at least one of phosphine or arsine.

11. The method of claim 1, wherein the III-V alloy comprises at least one of InP or InAs.

12. The method of claim 1, wherein the first layer has a thickness between about 50 nm and about 5 μm or between about 100 nm and about 2 μm.

13. The method of claim 1, wherein the second layer has a thickness between about 20 nm and about 200 nm or between about 50 nm and about 100 nm.

14. The method of claim 1, wherein the second layer has a thickness between thickness between about 50 nm and about 5 μm or between about 100 nm and about 2 μm.

15. The method of claim 1, wherein the solid layer has a thickness 50 nm and about 5 μm or between about 100 nm and about 2 μm.

* * * * *